United States Patent
Lee et al.

(10) Patent No.: US 11,329,133 B2
(45) Date of Patent: May 10, 2022

(54) INTEGRATED ASSEMBLIES HAVING SEMICONDUCTOR OXIDE CHANNEL MATERIAL, AND METHODS OF FORMING INTEGRATED ASSEMBLIES

(71) Applicant: Micron Technology, Inc., Boise, ID (US)

(72) Inventors: Yi Fang Lee, Boise, ID (US); Isamu Asano, Boise, ID (US); Ramanathan Gandhi, Boise, ID (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 366 days.

(21) Appl. No.: 16/688,854

(22) Filed: Nov. 19, 2019

(65) Prior Publication Data
US 2020/0161434 A1 May 21, 2020

Related U.S. Application Data

(60) Provisional application No. 62/770,081, filed on Nov. 20, 2018.

(51) Int. Cl.
*H01L 27/108* (2006.01)
*H01L 29/22* (2006.01)
(Continued)

(52) U.S. Cl.
CPC ...... *H01L 29/2206* (2013.01); *G11C 11/4023* (2013.01); *H01L 27/10805* (2013.01); *H01L 29/78693* (2013.01)

(58) Field of Classification Search
CPC ........... H01L 29/2206; H01L 27/10805; H01L 29/78693; H01L 27/10873; H01L 27/088;
(Continued)

(56) References Cited

U.S. PATENT DOCUMENTS 7,859,016 B2 12/2010 Hatano et al.
9,245,966 B2 1/2016 Park et al.
(Continued)

FOREIGN PATENT DOCUMENTS

JP 4-744700 8/2011
JP 2011-216665 10/2011
(Continued)

OTHER PUBLICATIONS

Yang et al., "Physical Properties of InGaO3(ZnO)m with Various Content Ratio Grown by PAMBE", Journal of Crystal Growth vol. 425, 2015, Netherlands, pp. 258-261.
(Continued)

*Primary Examiner* — Selim U Ahmed
(74) *Attorney, Agent, or Firm* — Wells St. John P.S.

(57) ABSTRACT

Some embodiments include an integrated assembly having a gate material, an insulative material adjacent the gate material, and a semiconductor oxide adjacent the insulative material. The semiconductor oxide has a channel region proximate the gate material and spaced from the gate material by the insulative material. An electric field along the gate material induces carrier flow within the channel region, with the carrier flow being along a first direction. The semiconductor oxide includes a grain boundary having a portion which extends along a second direction that crosses the first direction of the carrier flow. In some embodiments, the semiconductor oxide has a grain boundary which extends along the first direction and which is offset from the insulative material by an intervening portion of the semiconductor oxide. The carrier flow is within the intervening region and substantially parallel to the grain boundary. Some embodiments include methods of forming integrated assemblies.

54 Claims, 9 Drawing Sheets

(51) Int. Cl.
*H01L 29/786* (2006.01)
*G11C 11/402* (2006.01)

(58) Field of Classification Search
CPC ....... H01L 21/02263; H01L 21/823412; H01L 21/823437; H01L 21/823468; H01L 27/0705; H01L 27/105; H01L 2924/01031; H01L 2924/01049; H01L 27/115; H01L 27/11556; H01L 27/11582; H01L 27/0886; H01L 27/11568; H01L 21/76897; H01L 29/66772; H01L 27/1203; G11C 11/4023
See application file for complete search history.

(56) References Cited

U.S. PATENT DOCUMENTS

| | | |
|---|---|---|
| 2005/0020096 A1 | 1/2005 | Miyairi et al. |
| 2010/0044702 A1* | 2/2010 | Urayama ............ H01L 29/7869 257/43 |

FOREIGN PATENT DOCUMENTS

| | | |
|---|---|---|
| KR | 10-2012-0097152 | 9/2012 |
| WO | WO PCT/US2019/062269 | 5/2021 |

OTHER PUBLICATIONS

WO PCT/US2019/062269 Search Rept., dated Mar. 9, 2020, Micron Technology, Inc.
WO PCT/US2019/062269 Writ. Opin., dated Mar. 9, 2020, Micron Technology, Inc.

* cited by examiner

US 11,329,133 B2

INTEGRATED ASSEMBLIES HAVING SEMICONDUCTOR OXIDE CHANNEL MATERIAL, AND METHODS OF FORMING INTEGRATED ASSEMBLIES

RELATED PATENT DATA

This patent claims priority to and the benefit of U.S. Provisional Application Ser. No. 62/770,081 filed Nov. 20, 2018, the disclosure of which is incorporated herein by reference.

TECHNICAL FIELD

Integrated assemblies having semiconductor oxide channel material, and methods of forming integrated assemblies.

BACKGROUND

Semiconductor oxides (e.g., oxides comprising one or more of indium, gallium, zinc and tin) may be incorporated into integrated assemblies. For instance, the semiconductor oxides may be utilized to form channel regions of transistors. The transistors may be utilized as access devices in memory arrays, or in other applications.

It would be desirable to develop improved semiconductor oxides suitable for utilization in integrated assemblies, and to develop integrated components utilizing the improved semiconductor oxides.

DETAILED DESCRIPTION OF THE ILLUSTRATED EMBODIMENTS

Some embodiments include semiconductor oxides utilized in channel regions of transistors. The transistors may comprise conductive gate material, and may comprise insulative gate dielectric between the gate material and the semiconductor oxide. Operation of the transistors induces carrier flow (e.g., electron flow and/or hole migration) along the channel regions. The carriers flow along a first direction. The semiconductor oxides may be configured to have a grain boundary extending along the first direction, and spaced from the gate dielectric by an intervening region; and the current flow may be entirely within the intervening region so that it does not cross the grain boundary (i.e., is substantially parallel to the grain boundary). Alternatively, the semiconductor oxides may be configured to have grain boundaries that the current flow crosses. Example embodiments are described below with reference to FIGS. 1-21.

Figure 1:
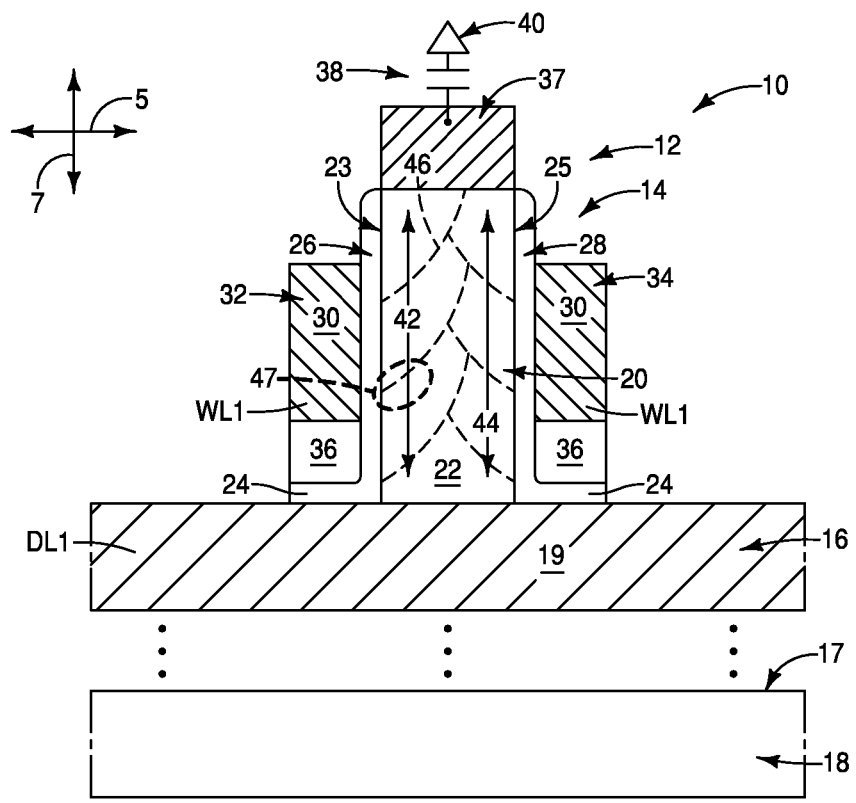
FIGS. 1 and 2 are diagrammatic cross-sectional side views of regions of example integrated assemblies comprising example transistors.

Referring to FIG. 1, such illustrates a region of an integrated assembly 10 comprising an example memory cell 12 having an example access device (transistor) 14. The transistor 14 is over a digit line 16, which in turn is supported by a base 18.

The base 18 may comprise semiconductor material; and may, for example, comprise, consist essentially of, or consist of monocrystalline silicon. The base 18 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 18 may correspond to a semiconductor substrate containing one or more materials associated with integrated circuit fabrication. Such materials may include, for example, one or more of refractory metal materials, barrier materials, diffusion materials, insulator materials, etc.

The base 18 comprises an upper surface 17 which extends horizontally. In some embodiments, the upper surface 17 may be considered to extend along a first direction; with such first direction being shown to be along an axis 5.

A gap is provided between the base 18 and the digit line 16 to indicate that there may be additional materials, electrical components, etc., provided between the base 18 and the digit line 16.

The digit line 16 comprises conductive material 19. The conductive material 19 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the digit line 16 may comprise, consist essentially of, or consist of one or both of tungsten and ruthenium.

The access device 14 includes a pillar 20 of semiconductor oxide 22. The semiconductor oxide may comprise any suitable composition; and in some embodiments may include one or more of indium, zinc, tin and gallium. For instance, the semiconductor oxide may comprise, consist essentially of, or consist of a composition having oxygen in combination with indium, zinc and gallium. The indium, zinc and gallium may be considered to be metals within such composition. The stoichiometric content of the composition may be expressed as a metal atomic percent. Specifically, the content of each of the metals of the semiconductor oxide may be express in terms of its concentration relative to the total concentration of all of the metals of the semiconductor oxide; and ignoring the concentration of the oxygen. In some example embodiments, the semiconductor oxide 22 may comprise a metal atomic percent of indium within a range of from about 14 to about 24, a metal atomic percent of gallium within a range of from about 37 to about 47, and a metal atomic percent of zinc within a range of from about 35 to about 45. In some example embodiments, the metal atomic percent of indium may be within a range of from about 16 to about 22, the metal atomic percent of gallium may be within a range of from about 39 to about 45, and the metal atomic percent of zinc may be within a range of from about 37 to about 43. It is noted that even minor variations in the stoichiometry of the semiconductor oxide may substantially alter physical characteristics of the semiconductor oxide. Accordingly, it can be advantageous to carefully control the metal content within the semiconductor oxide.

In the illustrated embodiment, the pillar 20 of the semiconductor oxide extends vertically; or, in other words, extends along a second axis 7 which is substantially orthogonal to the first axis 5. The term "substantially orthogonal" means orthogonal to within reasonable tolerances of fabrication and measurement.

The semiconductor oxide pillar 20 has opposing sidewall surfaces 23 and 25 along the cross-section of FIG. 1. The sidewall surface 23 may be referred to as a first sidewall surface, and the sidewall surface 25 may be referred to as a second sidewall surface.

The access device 14 includes insulative material 24 along the semiconductor oxide 22 (i.e., adjacent to the semiconductor oxide 22), and directly against the semiconductor oxide. The insulative material 24 may comprise any suitable composition(s). For instance, in some embodiments the insulative material 24 may comprise one or more high-k materials; with the term high-k meaning a dielectric constant greater than that of silicon dioxide. For instance, the insulative material 24 may comprise one or more metal oxides; and in some embodiments may comprise, consist essentially of, or consist of one or more of aluminum oxide, hafnium oxide, zirconium oxide, titanium oxide, etc. In some embodiments, the insulative material 24 may be referred to as insulative gate oxide or as gate dielectric.

In the shown embodiment, a first region 26 of the insulative material 24 is along the first sidewall surface 23 of the pillar 20, and a second region 28 of the insulative material 24 is along the second sidewall surface 25 of the pillar 20.

The access device 14 also includes gate material 30 along the insulative material 24, and directly against the insulative material. The gate material 30 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the gate material 30 may comprise one or both of tungsten and titanium nitride.

In the shown embodiment, a first region 32 of the gate material 30 is along the first region 26 of the insulative material 24, and a second region 34 of the gate material 30 is along the second region 28 of the insulative material. In some embodiments, the gate material 30 may be considered to be spaced from the semiconductor oxide 22 by the insulative material 24. In some embodiments, there may be additional compositions between the semiconductor oxide and the gate material (e.g., additional insulative compositions), and accordingly the gate material may be considered to be spaced from the semiconductor oxide by at least the insulative material 24.

The gate material 30 is supported over an insulative material 36. The insulative material 36 may comprise any suitable composition(s); and in some embodiments may comprise, consist essentially of, or consist of silicon dioxide. In some embodiments, the insulative material 36 may be omitted.

The pillar 20 of the semiconductor oxide 22 extends between a first conductive contact 37 and a second conductive contact corresponding to the digit line 16. The first conductive contact 37 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the first conductive contact 37 may comprise, consist essentially of, or consist of one or both of tungsten and ruthenium.

The conductive contact 37 is coupled with a charge-storage device 38; which in the shown embodiment is a capacitor. In other embodiments, the charge-storage device may have other configurations; and may, for example, comprise phase-change material, conductive-bridging material, etc.

The capacitor 38 has a node coupled with a reference voltage 40. Such reference voltage may be ground, Vcc/2, or any other suitable reference voltage.

The gate material 30 may be coupled with a wordline WL1, and the digit line 16 may correspond to a digit line DL1. In operation, a voltage is applied to the wordline WL1 which establishes electric fields along the first and second regions 32 and 34 of the gate material 30. Such electric fields induce carrier flow within a channel region comprised by the semiconductor oxide, with such carrier flow extending between the digit line 16 and the conductive contact 37. The carrier flow is diagrammatically illustrated with arrows 42 and 44. The carrier flow extends along the vertical direction of the pillar 20 (i.e., along the direction of the second axis 7).

In the shown embodiment, the semiconductor oxide 22 is polycrystalline. Individual grains of the polycrystalline material are bounded by grain boundaries. The grain boundaries are diagrammatically illustrated with dashed lines 46. The grains may have any suitable grain sizes; and in some embodiments the mean grain size may be within a range of from about 1 nanometer (nm) to about 100 nm; within a range of from about 1 nm to about 50 nm; within a range of from about 20 nm to about 25 nm; etc. The mean grain size may be determined with any suitable method(s). The crystallinity may be cubic crystallinity (i.e., may have a cubic unit cell, may comprise a cubic crystal system). In some embodiments, an individual crystalline grain may be referred to as being cubic crystallinity dominated, meaning that the crystallinity is substantially cubic, and may or may not be perfectly cubic throughout the entirety of the grain. The term "substantially cubic" means cubic to within reasonable tolerances. In some embodiments, polycrystalline material may be referred to as being predominately of cubic crystallinity, meaning that more than 50 volume percent of the polycrystalline material is of cubic crystallinity (or at least of substantially cubic crystallinity). In some embodiments, the content of cubic crystallinity (or substantial cubic crystallinity) within the polycrystalline material may be more than 70 volume percent, more than 90 volume percent, more than 95 volume percent, etc.

The direction of the carrier flow (indicated by arrows 42 and 44) crosses grain boundaries of the polycrystalline material 22. In other words, one or more of the grain boundaries has a portion (e.g., an illustrated portion 47) which extends along a direction that crosses the direction of the current flow. In some embodiments, the direction of the current flow may be referred to as a first direction, and the direction of the grain boundary may be referred to as a second direction. An advantage of having the carrier flow passing through one or more of the grain boundaries of the semiconductor oxide 22 may be that such enables the carrier flow to be modified through adjustment of the number of grain boundaries per unit length of the semiconductor oxide. Accordingly, the carrier flow may be tailored for specific applications by tailoring the grain size of the semiconductor oxide 22.

Figure 2:
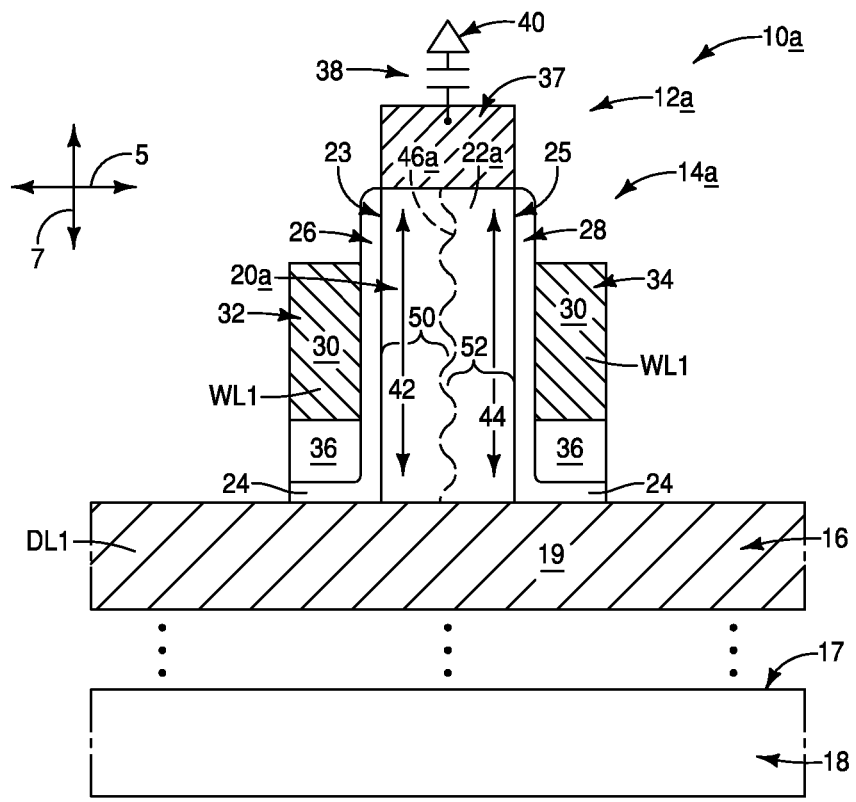

Referring to FIG. 2, such illustrates a region of an integrated assembly 10a comprising another example memory cell 12a having an example access device (transistor) 14a. The assembly 10a will be described with identical numbering as is utilized above in describing the assembly 10 of FIG. 1, where appropriate.

The transistor 14a is over the digit line 16, which in turn is supported by the base 18.

The base 18 comprises the horizontally-extending upper surface 17, with such upper surface extending along the first direction of the axis 5.

The access device 14a includes a pillar 20a of semiconductor oxide 22a. The semiconductor oxide may comprise any suitable composition; and in some embodiments may include one or more of indium, zinc, tin and gallium. For instance, the semiconductor oxide may comprise, consist essentially of, or consist of a composition having oxygen in combination with indium, zinc and gallium. In some example embodiments, the semiconductor oxide 22a may comprise a metal atomic percent of indium within a range of from about 16 to about 26, a metal atomic percent of gallium within a range of from about 45 to about 55, and a metal atomic percent of zinc within a range of from about 24 to about 34. In some example embodiments, the metal atomic percent of indium may be within a range of from about 18 to about 24, the metal atomic percent of gallium may be within a range of from about 47 to about 53, and the metal atomic percent of zinc may be within a range of from about 26 to about 32.

In the illustrated embodiment, the pillar 20a of the semiconductor oxide extends vertically; or, in other words, extends along the axis 7 which is substantially orthogonal to the axis 5.

The semiconductor oxide pillar 20a has the opposing first and second sidewall surfaces 23 and 25 along the cross-section of FIG. 2.

The access device 14a includes the insulative material 24 along the semiconductor oxide 22a, and directly against the semiconductor oxide. The first region 26 of the insulative material 24 is along the first sidewall surface 23 of the pillar 20a, and the second region 28 of the insulative material 24 is along the second sidewall surface 25 of the pillar 20a.

The access device 14 also includes the gate material 30 along the insulative material 24, and directly against the insulative material. The first region 32 of the gate material 30 is along the first region 26 of the insulative material 24, and the second region 34 of the gate material 30 is along the second region 28 of the insulative material. In some embodiments, the gate material 30 may be considered to be spaced from the semiconductor oxide 22 by the insulative material 24.

The gate material 30 is supported over the insulative material 36.

The pillar 20a of the semiconductor oxide 22a extends between the first conductive contact 37 and the second conductive contact corresponding to the digit line 16.

The conductive contact 37 is coupled with the charge-storage device 38, which in the shown embodiment is a capacitor.

The gate material 30 is coupled with the wordline WL1, and the digit line 16 corresponds to the digit line DL1. In operation, a voltage is applied to the wordline WL1 which establishes the electric fields along the first and second regions 32 and 34 of the gate material 30. Such electric fields induce the carrier flow within a channel region comprised by the semiconductor oxide 22a, with such carrier flow extending between the digit line 16 and the conductive contact 37. The carrier flow is diagrammatically illustrated with the arrows 42 and 44. The carrier flow extends along the vertical direction of the pillar 20a.

In the shown embodiment, the semiconductor oxide 22a is configured to have a grain boundary 46a extending along the vertical direction of axis 7 and traversing an entire length of the semiconductor oxide 22a from the digit line 16 to the conductive contact 37. The grain boundary 46a is offset from the first region 26 of the insulative material 24 by a first intervening region 50 of the semiconductor oxide 22a, and is offset from the second region 28 of the insulative material 24 by a second intervening region 52 of the semiconductor oxide 22a. The grain boundary 46a is shown to be wavy in the embodiment of FIG. 2. In other embodiments, the grain boundary may be substantially straight, or may have other configurations; but regardless, will extend substantially vertically along the pillar 20a. The semiconductor oxide 22a may have cubic crystallinity.

The carrier flow within the semiconductor oxide 22a (indicated by arrows 42 and 44) is within the intervening regions 50 and 52, and is predominately along (i.e., substantially parallel to) the vertical direction of the grain boundary 46a; and in some embodiments does not cross the grain boundary 46a. The term "substantially parallel" means along the same general direction as the grain boundary, and in some embodiments may be parallel to within reasonable tolerances of measurement. The intervening regions 50 and 52 may be very uniform in physical and chemical properties. An advantage of having the carrier flow passing within the intervening regions 50 and 52 of the semiconductor oxide 22a may be that such enables the carrier flow to be uniform across a large number of substantially identical access devices 14a.

Figure 3:
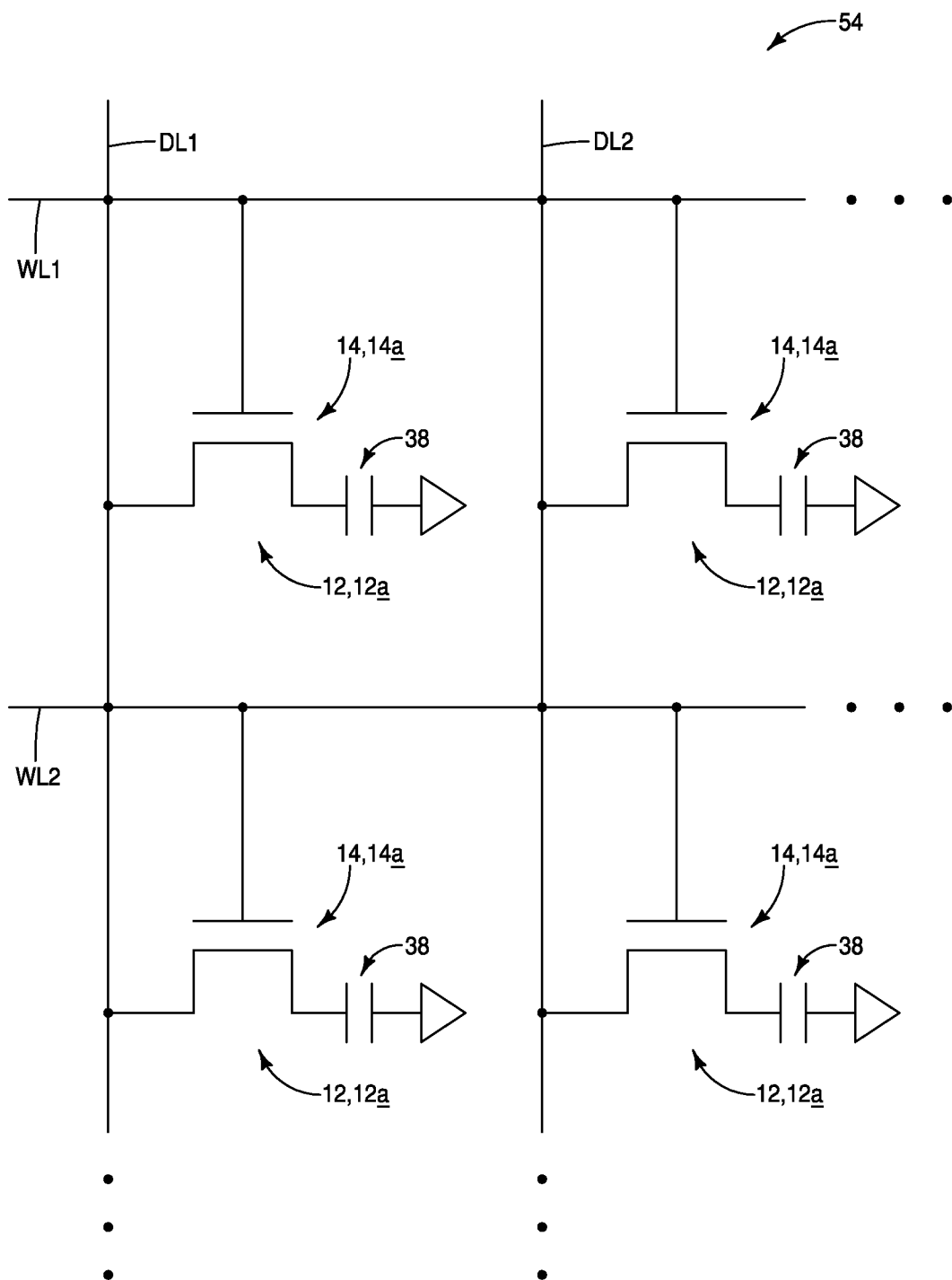
FIG. 3 is a diagrammatic schematic illustration of a region of an example memory array.

In some embodiments, the memory cells 12 and 12a of FIGS. 1 and 2 may be representative memory cells incorporated into memory arrays. All of the memory cells within a given memory array may be substantially identical to one another; with the term "substantially identical" meaning identical to within reasonable tolerances of fabrication and measurement. FIG. 3 shows a region of an example memory array 54. The memory array includes wordlines WL1 and WL2, and digit lines DL1 and DL2. The memory array also includes a plurality of memory cells 12 or 12a. The wordlines may be considered to extend along rows of the memory array, and the digit lines may be considered to extend along columns of the memory array. Each of the memory cells is uniquely addressed utilizing one of the wordlines and one of the digit lines. The illustrated memory array is a dynamic random-access memory (DRAM) array. In other embodiments, the transistors 14 and 14a of the types described above with reference to FIGS. 1 and 2 may be utilized in other types of memory arrays. Additionally, or alternatively, the transistors may be utilized in other circuitry; such as, for example, logic, sensors, etc.

The transistors 14 and 14a of FIGS. 1 and 2 are shown to have vertically-extending pillars of semiconductor oxide, and to have carrier flow extending vertically along such pillars. In other embodiments, analogous transistors may have other configurations. For instance, FIGS. 4 and 5 show transistors configured for horizontal carrier flow.

Figure 4:
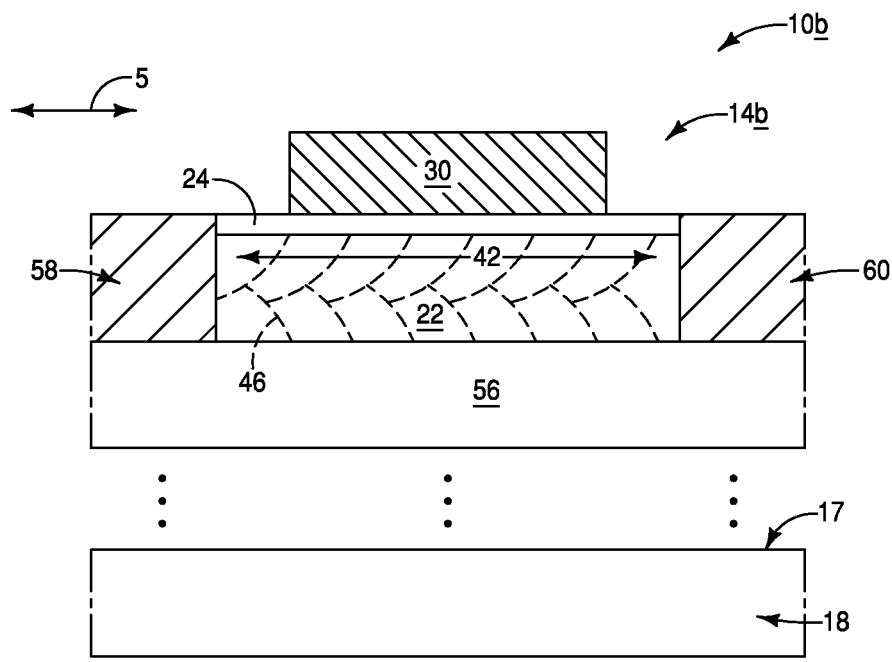
FIGS. 4-6 are diagrammatic cross-sectional side views of regions of example integrated assemblies comprising example transistors.
Figure 5:
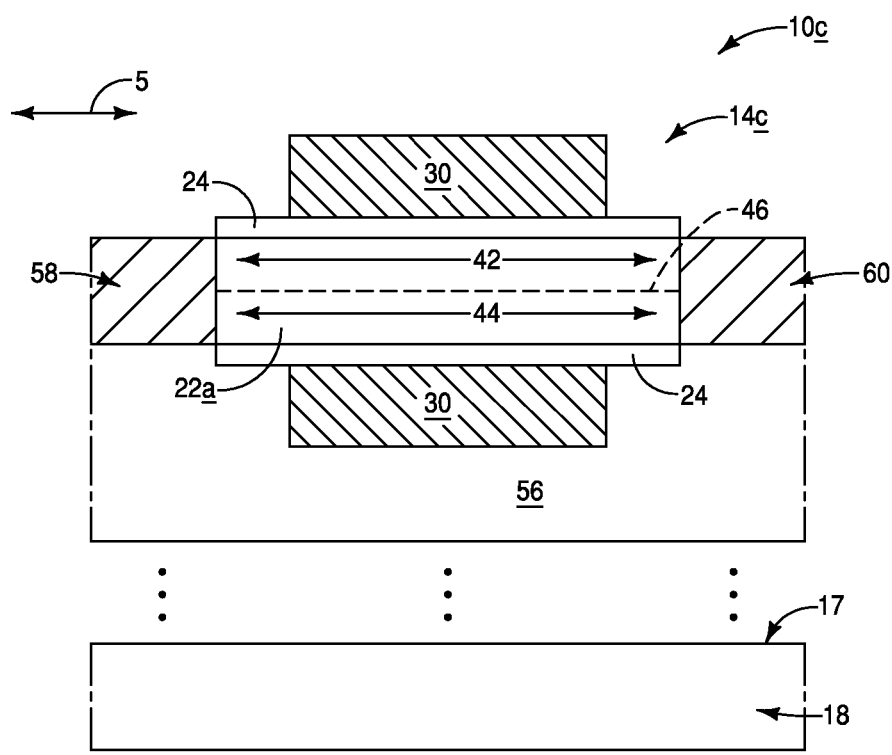

Referring to FIG. 4, a region of an integrated assembly 10b is shown to comprise a transistor 14b. The transistor 14b includes a semiconductor oxide 22 of the type described above with reference to FIG. 1. Such semiconductor oxide extends horizontally, and specifically extends along the same direction as the horizontally-extending upper surface 17 of the base 18 (i.e., the direction of axis 5).

The semiconductor oxide 22 is supported by an insulative material 56. Such insulative material may comprise any suitable composition(s); and in some embodiments may comprise, consist essentially of, or consist of one or both of silicon dioxide and silicon nitride.

The semiconductor oxide 22 extends between a first contact 58 and a second contact 60. The first and second contacts 58 and 60 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The insulative material 24 is over the semiconductor oxide 22, and the gate material 30 is over the insulative material 24.

In operation, an electric field along the gate material 30 induces carrier flow within a channel region of the semiconductor oxide 22. The carrier flow is represented by the arrow 42, and in the shown embodiment extends substantially parallel to the horizontally-extending upper surface 17 of the base 18 (i.e., extends along the axis 5).

Referring to FIG. 5, a region of an integrated assembly 10c is shown to comprise a transistor 14c. The transistor 14c includes a semiconductor oxide 22a of the type described above with reference to FIG. 1. Such semiconductor oxide extends horizontally, and specifically extends along the same direction as the horizontally-extending upper surface 17 of the base 18 (i.e., the direction of axis 5).

The semiconductor oxide 22a is supported by the insulative material 56, and extends between a first contact 58 and a second contact 60.

The insulative material 24 is over and under the semiconductor oxide 22a, and the gate material 30 is over and under the insulative material 24. Thus, the semiconductor oxide 22a is vertically between upper and lower regions of the material 30 in the embodiment of FIG. 5 (i.e., assembly 10c). Such is in contrast to the embodiment of FIG. 4 (i.e., assembly 10b) which has only a single region of the gate material 30 (specifically, a region of the gate material 30 over the semiconductor oxide). In some embodiments, the semiconductor oxide 22a of assembly 10c may be adjacent only a single region of the gate material 30 analogous to the embodiment of FIG. 4; and in some embodiments the gate dielectric material (gate oxide material) 22 of FIG. 4 (assembly 10b) may be provided between upper and lower regions of gate material analogous to the embodiment of FIG. 5.

Referring still to the embodiment of FIG. 5, an electric field along the gate material 30 induces carrier flow within channel regions of the semiconductor oxide 22a. The carrier flow is represented by the arrows 42 and 44, and in the shown embodiment extends substantially parallel to the horizontally-extending upper surface 17 of the base 18 (i.e., extends along the axis 5).

Figure 6:
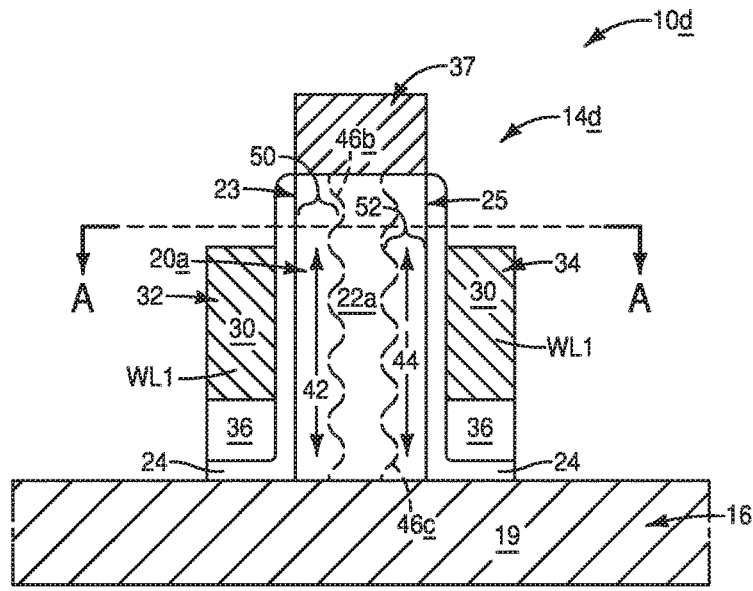

It is noted that the embodiment described above with reference to FIG. 2 shows a single vertically-extending grain boundary along an approximate center of the semiconductor oxide pillar 20a. In some embodiments, such grain boundary results from recrystallization within the semiconductor oxide 22a and propagates inwardly from the sidewall surfaces 23 and 25 of the pillar 20a. Accordingly, structures may be formed which are analogous to the structure of FIG. 2, but in which grain boundaries extending inwardly from the surfaces 23 and 25 have not merged into a single grain boundary extending down the center of the pillar 20a. Instead, there may be a pair of grain boundaries extending vertically along the pillar 20a, as shown in FIG. 6. Specifically, FIG. 6 shows an integrated assembly 10d comprising a transistor 14d analogous to the transistor 14a of FIG. 2. However, the transistor 14d comprises two grain boundaries 46b and 46c extending vertically along the pillar 20a, rather than comprising the single grain boundary 46a shown in FIG. 2. The intervening regions 50 and 52 are between the surfaces 23 and 25 and the grain boundaries 46b and 46c, respectively. Such intervening regions comprise channel regions of the transistor, and the carrier flow (represented by arrows 42 and 44) extends vertically along such channel regions.

Figure 7:
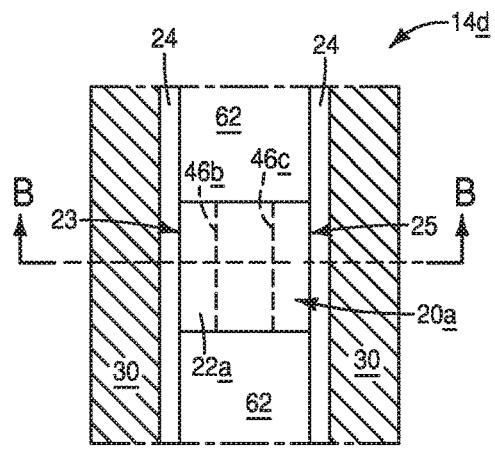
FIGS. 7 and 8 are diagrammatic cross-sectional top-down views along the line A-A showing example embodiment configurations of the example integrated assembly of FIG. 6. The cross-sectional side view of FIG. 6 is along the lines B-B of FIGS. 7 and 8.
Figures 8, 8A:
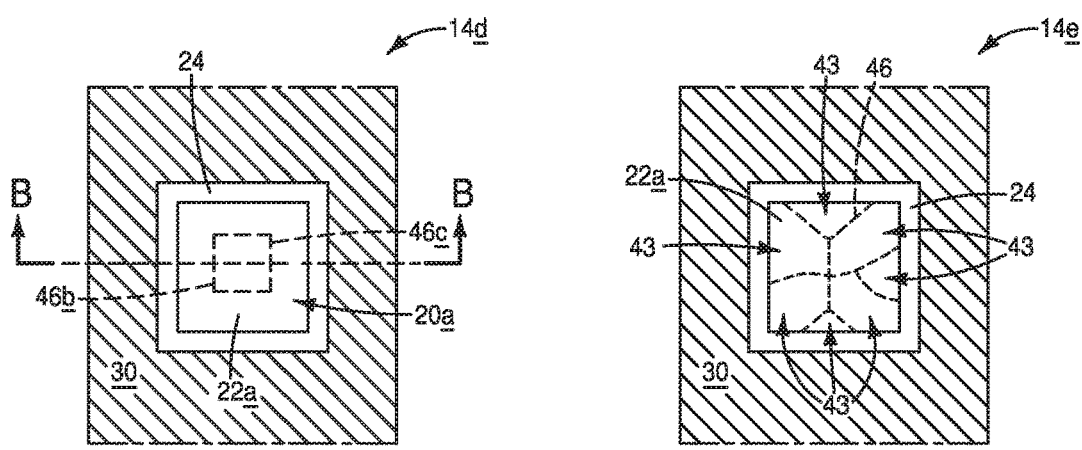
FIG. 8A is a diagrammatic cross-sectional top-down view of a region of an example integrated assembly alternative to the assembly of FIG. 8.

FIGS. 7 and 8 show a pair of top-down views along the line A-A of FIG. 6 to indicate alternative configurations of the transistor 14d. It is noted that the side view of FIG. 6 is along the lines B-B of FIGS. 7 and 8.

Referring to FIG. 7, the gate material 30 and insulative material 24 are along two opposing sides of the pillar 20a of semiconductor oxide 22a, and an insulative material 62 is along the other two opposing sides of the pillar 20a. The insulative material 62 may comprise any suitable composition(s); and in some embodiments may comprise, consist essentially of, or consist of one or both of silicon dioxide and silicon nitride. The grain boundary regions 46b and 46c are parallel to the opposing sidewall surfaces 23 and 25.

Referring to FIG. 8, the insulative 24 and gate material 30 entirely surround the pillar 20a in a gate-all-around configuration. The grain boundaries 46b and 46c are part of a continuous grain boundary structure within the semiconductor oxide 22a. In the shown embodiment, the grain boundary structure is polygonal (specifically, substantially square) and conformal to the configuration of the gate material 30 extending around the pillar 20a. It is noted that there may be a plurality of grain boundaries, or at least one grain boundary; the crystalline grains may be considered to be columnar in some embodiments; and the crystalline grains may or may not extend all the way down to the underlying "substrate" corresponding to the conductive material 19.

FIG. 8A shows a top-down view of an assembly alternative to that of FIG. 8, and shows a region of a transistor 14e. The grain boundaries 46 are vertically oriented like the boundaries 46b/46c of FIGS. 6 and 8, and are along columnar grain structures 43. In some embodiments, there may be a plurality of vertically-oriented grain boundaries 46 extending within the semiconductor oxide 22a, and in some embodiments there may be at least one vertically-oriented grain boundary 46 extending within the semiconductor oxide 22a.

The structures described above may be formed with any suitable methods. Example methods are described with reference to FIGS. 9-21; with FIGS. 9-14 illustrating an example method for forming the transistor 14 of FIG. 1, and with FIGS. 15-21 illustrating an example method for forming the transistor 14a of FIG. 2. The base 18 is not shown in FIGS. 9-21 in order to simplify the drawings.

Figure 9:
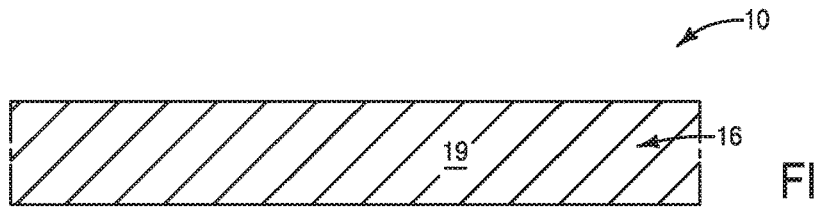
FIGS. 9-14 are diagrammatic cross-sectional side views of a region of an example integrated assembly shown at example process stages of an example method for fabricating the integrated assembly of FIG. 1.

Referring to FIG. 9, the fabrication of the integrated assembly 10 of FIG. 1 begins with provision of the conductive material 19 of component 16. In some embodiments the conductive material 19 may have an upper surface which comprises, consists essentially of, or consists of one or both of tungsten and ruthenium. The remainder of the conductive material 19 may be a same composition as such upper surface, or may be a different composition relative to such upper surface.

Figure 10:
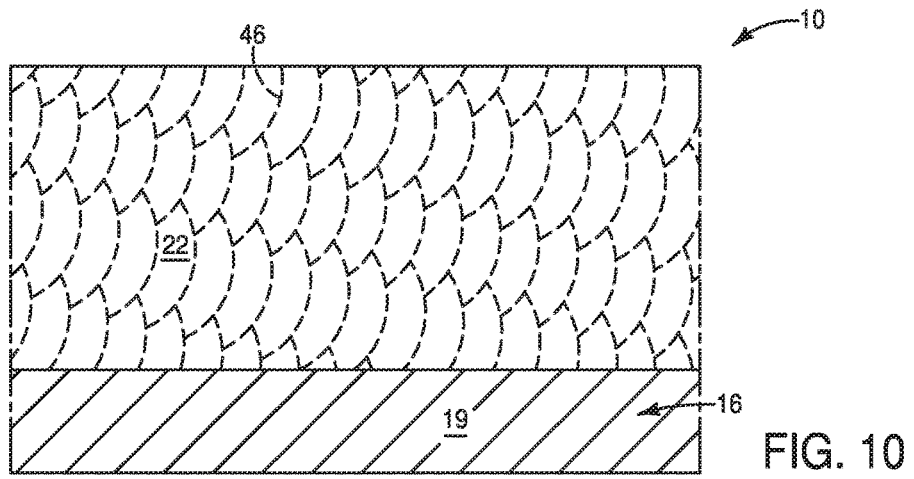

Referring to FIG. 10, the semiconductor oxide 22 is deposited over the conductive material 19; and in the shown embodiment is deposited directly onto the conductive material 19. The semiconductor oxide 22 may be deposited with any suitable conditions utilizing any suitable processing. In some embodiments, the deposition may utilize one or more of atomic layer deposition (ALD), chemical vapor deposition (CVD) and physical vapor deposition (PVD). In an example embodiment, the deposition of the semiconductor oxide 22 may utilize PVD, and may be conducted within a chamber utilizing an ambient within the chamber having a temperature within a range of from about 20° C. to about 500° C. and a pressure within a range of from about 1 millitorr (mTorr) to about 9 mTorr. In some embodiments, the temperature of the ambient may be within a range of from about 80° C. to about 150° C.

The semiconductor oxide 22 of FIG. 10 may comprise any of the compositions described above with reference to FIG. 1. In some embodiments, the semiconductor oxide may comprise indium, gallium and zinc. In such embodiments, the physical vapor deposition of the semiconductor oxide may utilize multiple targets to achieve the desired concentrations of indium, gallium and zinc; or may utilize a single target having the desired concentration.

The deposited semiconductor oxide 22 is polycrystalline (with grain boundaries being diagrammatically illustrated utilizing the dashed lines 46).

Figure 10A:
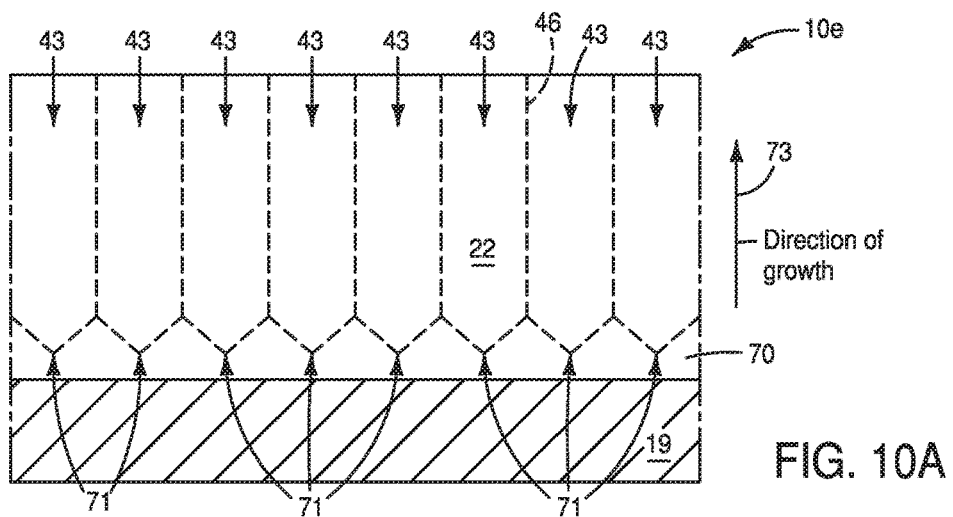
FIG. 10A is a diagrammatic cross-sectional side view of a region of an example integrated assembly alternative to the assembly of FIG. 10.

FIG. 10A shows an integrated assembly 10e alternative to the assembly 10 of FIG. 10. The assembly 10e has the vertically-oriented grain boundaries of FIG. 8A, and has the columnar grain structure 43. There may be an amorphous region 70 of semiconductor oxide 22 under the grains 43. Such amorphous region may have any suitable thickness; including, for example, a thickness of about 50 Å. The grains 43 grow along the direction of grain growth indicated relative to the arrow 73 of FIG. 10A; and may grow during deposition of the semiconductor oxide 22 and/or with an anneal following the deposition. Regions 71 may correspond to crystal nucleation regions. In some embodiments, the grains 43 may be considered to result from bilateral growth, with increasing thickness along the growth direction 73.

Figure 11:
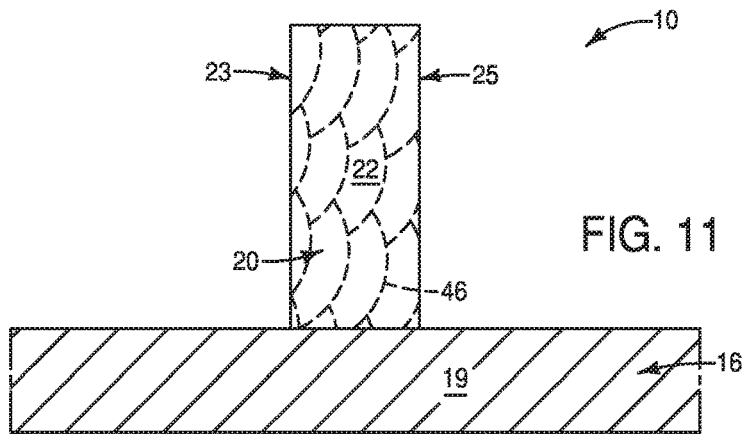

FIG. 11 shows assembly 10 at a process stage subsequent to that of FIG. 10. The semiconductor oxide 22 is patterned into a vertically-extending structure corresponding to the pillar 20. Such structure has the opposing sidewall surfaces 23 and 25 along the cross-section of FIG. 11. In some embodiments, the grain structure may comprise vertical columns (e.g., columnar grains analogous to those of FIG. 10A) as-deposited.

Figure 12:
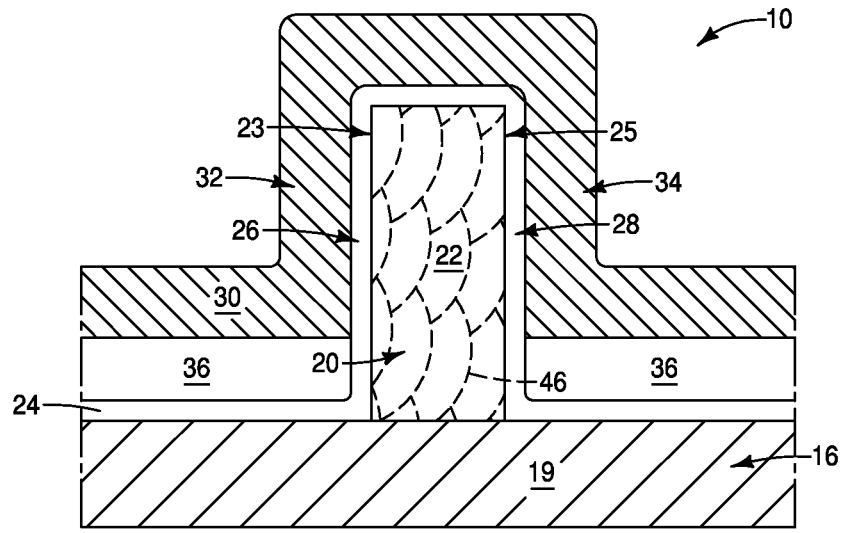

Referring to FIG. 12, the insulative material 24 is formed along the opposing sidewalls 23 and 25 of the pillar 20, and also over the pillar. The insulative material 24 includes the first region 26 along the sidewall surface 23, and the second region 28 along the sidewall surface 25.

The insulative material 36 is formed over the insulative material 24; and the gate material 30 is formed over the insulative material 36 and the pillar 20. The gate material 30 comprises the first region 32 along the first region 26 of the insulative material 24, and comprises the second region 34 along the second region 28 of the insulative material 24. The insulative material 36 may be omitted in some embodiments.

Figure 13:
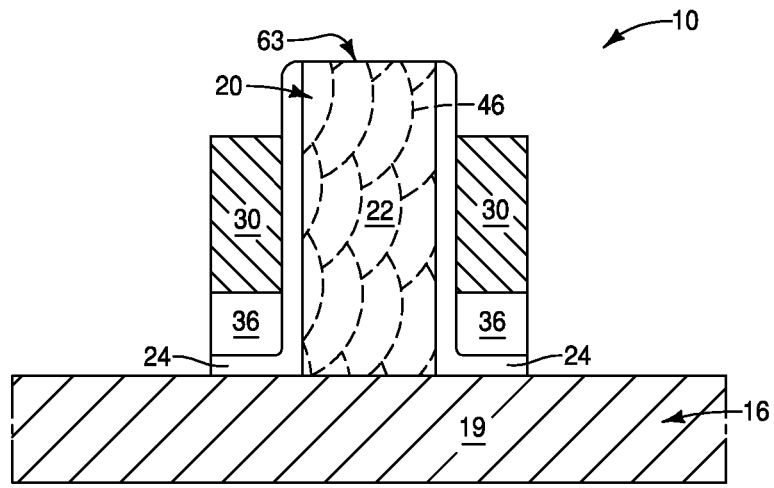

Referring to FIG. 13, the materials 24, 36 and 30 are patterned. The patterning may comprise any suitable combination of masks and etches. Such patterning removes the materials 30 and 24 from over an upper surface 63 of the pillar 20. The assembly 10 of FIG. 13 may be provided within a chamber and subjected to an anneal while the upper surface 63 is exposed to a desired ambient. For instance, in some embodiments the upper surface 63 may be exposed to an oxidizing ambient (e.g., an ambient comprising one or both of $O_2$ and $O_3$) to replenish oxygen that may have been lost from the semiconductor oxide 22 during the patterning of materials 24, 30 and 36. The annealing may be conducted at any suitable temperature (e.g., a temperature of at least about 400° C.) for any suitable duration (e.g., a duration of greater than about 30 minutes). The temperature may be a temperature of an ambient within the chamber during the anneal, may be a temperature of a chuck or other structure retaining assembly 10 within the chamber, and/or may be a temperature of the pillar 20 of semiconductor oxide 22. The annealing may enable chemical constituents within the semiconductor oxide 22 to redistribute so that the composition of the semiconductor oxide 22 becomes more uniform than it was before the annealing, may enable grain sizes to be adjusted within the semiconductor oxide 22, etc.

Figure 14:
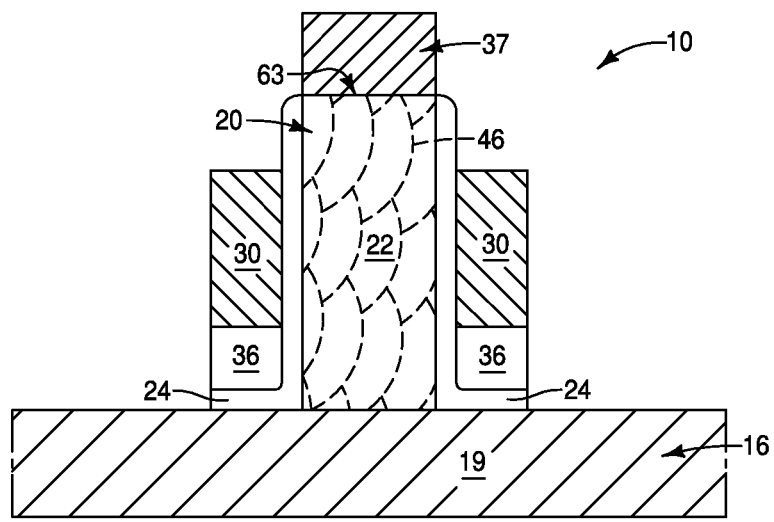

Referring to FIG. 14, the conductive contact 37 is formed over the upper surface 63 of the pillar 20 to complete fabrication of the transistor 14, with such transistor being identical to that described above with reference to FIG. 1. The conductive contact 37 may be formed and patterned utilizing any suitable processing. In some embodiments, the conductive material 37 is deposited over the material 22 at the process stage of FIG. 10, and then patterned together with the material 22.

Figure 15:
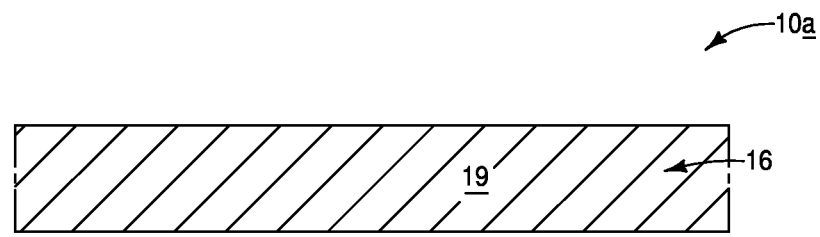
FIGS. 15-21 are diagrammatic cross-sectional side views of a region of an example integrated assembly shown at example process stages of an example method for fabricating the integrated assembly of FIG. 2.

Referring to FIG. 15, the fabrication of the integrated assembly 10a of FIG. 2 begins with provision of the conductive material 19 of component 16. In some embodiments the conductive material 19 may have an upper surface which comprises, consists essentially of, or consists of one or both of tungsten and ruthenium. The remainder of the conductive material 19 may be a same composition as such upper surface, or may be a different composition relative to such upper surface.

Figure 16:
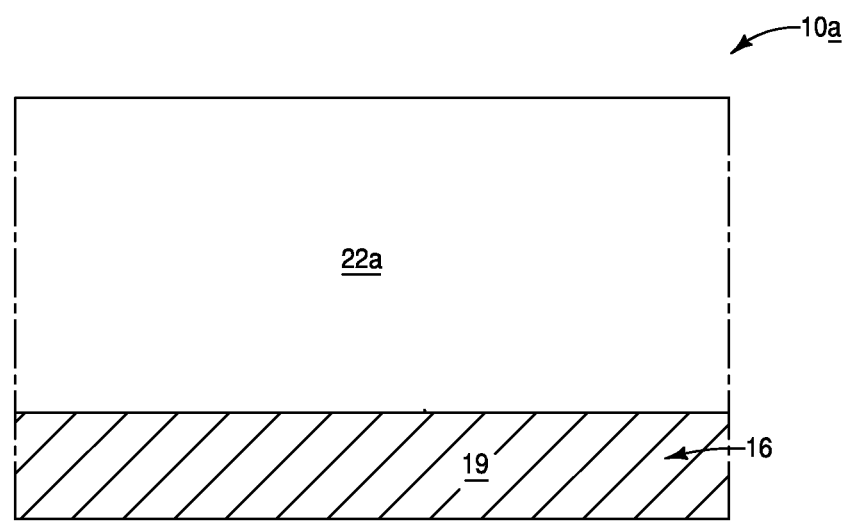

Referring to FIG. 16, the semiconductor oxide 22a is deposited over the conductive material 19; and in the shown embodiment is deposited directly onto the conductive material 19. The semiconductor oxide 22a may be deposited with any suitable conditions utilizing any suitable processing; and in some embodiments may utilize one or more of ALD, CVD and PVD. In an example embodiment, the deposition of the semiconductor oxide 22a may utilize PVD, and may be conducted within a chamber utilizing an ambient within the chamber having a temperature within a range of from about 20° C. to about 500° C. and a pressure within a range of from about 1 mTorr to about 9 mTorr. In some embodiments, the temperature of the ambient may be within a range of from about 80° C. to about 150° C.

The semiconductor oxide 22a of FIG. 16 may comprise any of the compositions described above with reference to FIG. 2. In some embodiments, the semiconductor oxide may comprise indium, gallium and zinc. In such embodiments, the physical vapor deposition of the semiconductor oxide may utilize multiple targets to achieve the desired concentrations of indium, gallium and zinc; or may utilize a single target having the desired concentration.

The deposited semiconductor oxide 22a may or may not be crystalline; and in some embodiments may be polycrystalline and/or amorphous. Grain boundaries are not shown relative to the processing step of FIG. 16.

Figure 17:
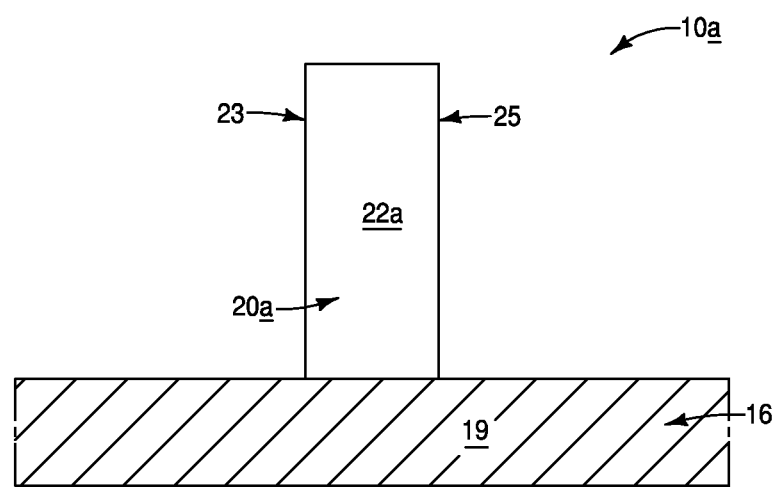

Referring to FIG. 17, the semiconductor oxide 22a is patterned into a vertically-extending structure corresponding to the pillar 20a. Such structure has the opposing sidewall surfaces 23 and 25 along the cross-section of FIG. 17.

Figure 18:
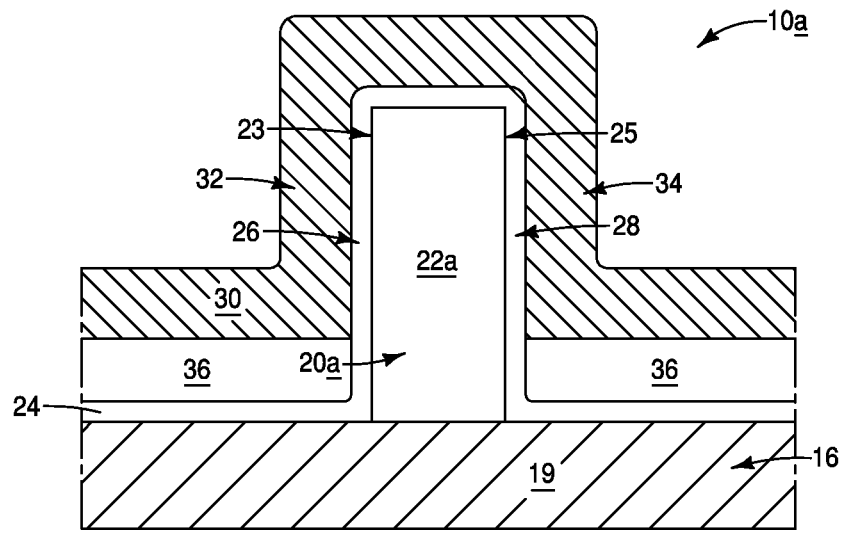

Referring to FIG. 18, the insulative material 24 is formed along the opposing sidewalls 23 and 25 of the pillar 20a, and also over the pillar. The insulative material 24 includes the first region 26 along the sidewall surface 23, and the second region 28 along the sidewall surface 25.

The insulative material 36 is formed over the insulative material 24; and the gate material 30 is formed over the insulative material 36 and the pillar 20a. The gate material 30 comprises the first region 32 along the first region 26 of the insulative material 24, and comprises the second region 34 along the second region 28 of the insulative material 24.

Figure 19:
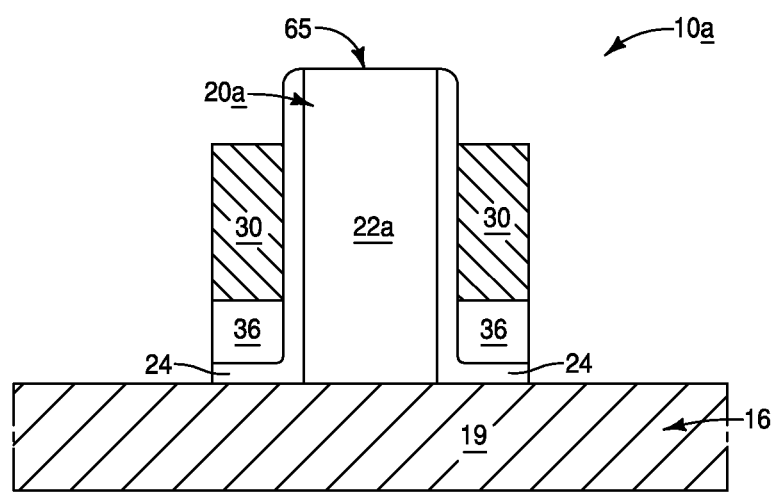

Referring to FIG. 19, the materials 24, 36 and 30 are patterned. The patterning may comprise any suitable combination of masks and etches. Such patterning removes the materials 30 and 24 from over an upper surface 65 of the pillar 20a. The assembly 10a of FIG. 19 may be provided within a chamber and subjected to an anneal while the upper surface 65 (i.e., top portion 65) is exposed to a desired ambient. For instance, in some embodiments the upper surface 65 may be exposed to an oxidizing ambient (e.g., an ambient comprising one or both of $O_2$ and $O_3$) to replenish oxygen that may have been lost from the semiconductor oxide 22 during the patterning of materials 24, 30 and 36. In other embodiments, the upper surface 65 may be exposed to a reducing ambient (e.g., an ambient comprising reductant; such as an ambient comprising $H_2$). In yet other embodiments, the ambient may consist of gases inert relative to reaction with the exposed top portion of the semiconductor oxide 22a (e.g., the ambient may consist of one or both of argon and $N_2$).

The annealing may be conducted at any suitable temperature (e.g., a temperature of at least about 400° C.) for any suitable duration (e.g., a duration of greater than about 30 minutes). The temperature may be a temperature of an ambient within the chamber during the anneal, may be a temperature of a chuck or other structure retaining assembly 10a within the chamber, and/or may be a temperature of the pillar 20a of semiconductor oxide 22a. In some embodiments, the annealing may be conducted while a temperature of the semiconductor oxide is maintained within a range of from about 400° C. to about 600° C. for a duration within a range of from about 30 minutes to about one day; such as, for example, a duration of from about 30 minutes to about 10 hours.

Figure 20:
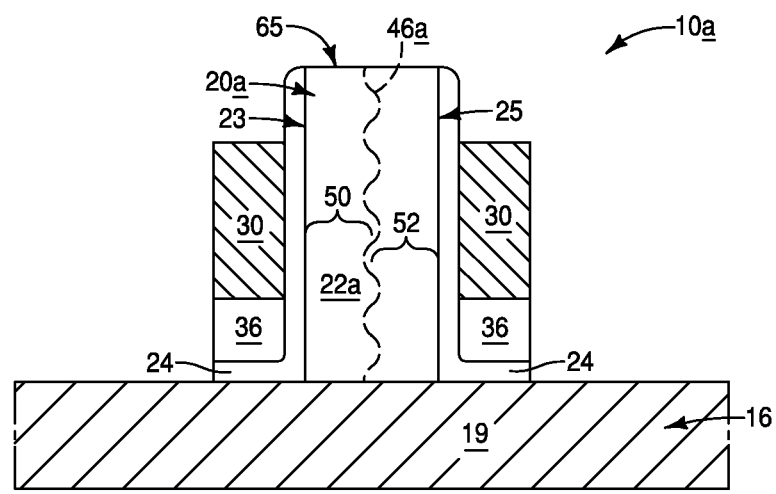

The annealing may crystallize and/or recrystallize the semiconductor oxide 22a to form at least one grain boundary 46a (or "seam") extending vertically through the semiconductor oxide 22a, as shown in FIG. 20. In the illustrated embodiment, the grain boundary 46a traverses an entire length of the vertically-extending pillar 20a from the top surface 65 to the conductive material 19. The grain boundary is offset from the first and second surfaces 23 and 25 of the pillar 20a by the intervening regions 50 and 52. In the illustrated embodiment, such intervening regions have about the same widths as one another along a horizontal direction. In other embodiments, one of the intervening regions may be wider than the other.

It may be useful in understanding some of the embodiments described herein to provide a brief description of a possible mechanism. However, the claims which follow are not to be limited to any particular mechanism except to the extent, if any, that such mechanism is expressly recited within such claims. It is believed that the vertically-extending grain boundary 46 may result from recrystallization of the semiconductor oxide 22a, with such recrystallization propagating from surfaces adjacent the insulative 24 inwardly toward the center of the pillar 20a. The grain boundary 46a is strongly visible in cross-sections of structures formed in accordance with the processing described herein. While other, lesser, grain boundaries may be present, such are much less dominant than the grain boundary 46a. In some embodiments, the grain boundary 46a may be referred to as a primary grain boundary to indicate that, to the extent that other grain boundaries are present, such are much less dominant than the grain boundary 46a.

Figure 21:
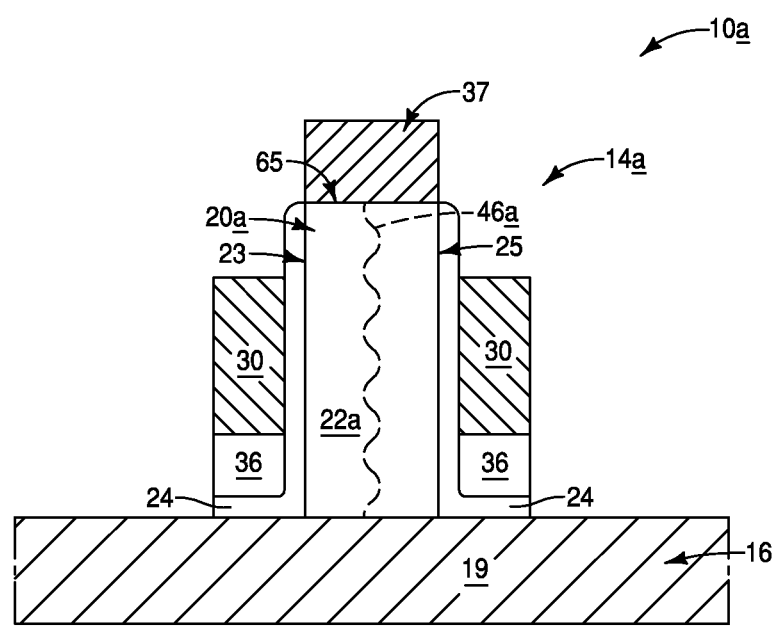

Referring to FIG. 21, the conductive contact 37 is formed over the upper surface 65 of the pillar 20a to complete fabrication of the transistor 14a, with such transistor being identical to that described above with reference to FIG. 2. The conductive contact 37 may be formed and patterned utilizing any suitable processing.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, ALD, CVD, PVD, etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a gate material, an insulative material along the gate material, and a semiconductor oxide along (adjacent) the insulative material. The semiconductor oxide has a channel region proximate the gate material and spaced from the gate material by at least the insulative material. Carrier flow within the channel region being induced in response to an electric field along the gate material, with the carrier flow being along a first direction. The semiconductor oxide is polycrystalline, with individual grains of the polycrystalline semiconductor oxide being peripherally bounded by grain boundaries. At least one of the grain boundaries has a portion which extends along a second direction, with the second direction crossing the first direction of the carrier flow.

Some embodiments include an integrated assembly having a gate material, an insulative material along (adjacent) the gate material and a semiconductor oxide along the insulative material. The semiconductor oxide has a channel region proximate the gate material and spaced from the gate material by at least the insulative material. Carrier flow within the channel region being induced in response to an electric field along the gate material, with the carrier flow being along a first direction. The semiconductor oxide has at least one grain boundary which extends along the first direction and which is offset from the insulative material by an intervening portion of the semiconductor oxide. The carrier flow is within the intervening region and substantially parallel to said at least one grain boundary.

Some embodiments include an integrated assembly having a semiconductor oxide extending along a vertical direction between a first conductive contact and a second conductive contact. The semiconductor oxide has first and second opposing sidewall surfaces along a cross-section. A first region of an insulative material is along the first sidewall surface, and a second region of the insulative material is along the second sidewall surface. A first region of a gate material is along the first region of the insulative material and is spaced from the first sidewall surface by at least the first region of the insulative material, and a second region of the gate material is along the second region of the insulative material and is spaced from the second sidewall surface by the second region of the insulative material. Electric fields along the first and second regions of the gate material induce carrier flow within the semiconductor oxide, with the carrier flow being along a first direction corresponding to the vertical direction of the semiconductor oxide. The semiconductor oxide is polycrystalline. Individual grains of the polycrystalline semiconductor oxide are peripherally bounded by grain boundaries. At least one of the grain boundaries has a portion which extends along a second direction, with the second direction crossing the first direction of the carrier flow.

Some embodiments include an integrated assembly having a semiconductor oxide extending along a vertical direction between a first conductive contact and a second conductive contact. The semiconductor oxide has first and second opposing sidewall surfaces along a cross-section. A first region of an insulative material is along the first sidewall surface, and a second region of the insulative material is along the second sidewall surface. A first region of a gate material is along the first region of the insulative material and is spaced from the first sidewall surface by at least the first region of the insulative material, and a second region of the gate material is along the second region of the insulative material and is spaced from the second sidewall surface by the second region of the insulative material. A grain boundary is within the semiconductor oxide and extends along the vertical direction. The grain boundary traverses an entire length of the semiconductor oxide from the first contact to the second contact. The grain boundary is offset from the first region of the insulative material by a first intervening portion of the semiconductor oxide, and is offset from the second region of the insulative material by a second intervening portion of the semiconductor oxide. Carrier flow within the semiconductor oxide being induced in response to electric fields along the first and second regions of the gate material, with the carrier flow being along the vertical direction of the semiconductor oxide. The carrier flow within the semiconductor oxide is within the intervening regions and substantially parallel to the grain boundary.

Some embodiments include a method of forming an integrated assembly. Semiconductor oxide is deposited over a conductive material. The semiconductor oxide comprises indium, gallium and zinc. The depositing is physical vapor depositing and is conducted within a chamber utilizing an ambient within the chamber having a temperature within a range of from about 20° C. to about 500° C., and a pressure within a range of from about 1 mTorr to about 9 mTorr. The deposited semiconductor oxide is polycrystalline. The deposited semiconductor oxide is patterned into a vertically-extending structure. The vertically-extending structure has first and second opposing sidewall surfaces along a cross-section. Insulative material is formed along the first and second opposing sidewall surfaces. A first region of the insulative material is along the first sidewall surface, and a second region of the insulative material being is the second sidewall surface. Gate material is formed along the insulative material. A first region of the gate material is along the first region of the insulative material, and a second region of the gate material is along the second region of the insulative material. The semiconductor oxide, the first and second regions of the insulative material, and the first and second regions of the gate material together form a transistor. The transistor is configured such that electric fields along the first and second regions of the gate material induce carrier flow within the semiconductor oxide, with the carrier flow being along a first direction corresponding to the vertical direction of the semiconductor oxide. Individual grains of the polycrystalline semiconductor oxide are peripherally bounded by grain boundaries. At least one of the grain boundaries has a portion which extends along a second direction, with the second direction crossing the first direction of the carrier flow.

Some embodiments include a method of forming an integrated assembly. Semiconductor oxide is deposited over a supporting material. The semiconductor oxide comprises indium, gallium and zinc. The deposited semiconductor oxide is patterned into a vertically-extending structure. The vertically-extending structure has first and second opposing sidewall surfaces along a cross-section. Insulative material is formed along the first and second opposing sidewall surfaces. A first region of the insulative material is along the first sidewall surface, and a second region of the insulative material is along the second sidewall surface. Gate material is formed along the insulative material. A first region of the gate material is along the first region of the insulative material, and a second region of the gate material is along the second region of the insulative material. After the insulative material is formed, the semiconductor oxide is annealed under conditions which maintain a temperature of the semiconductor oxide within a range of from about 400° C. to about 600° C. for a duration of from at least about 30 minutes to less than or equal to about 1 day. After the annealing, a grain boundary is within the semiconductor oxide and extends along the vertical direction. The grain boundary traverses an entire length of the semiconductor oxide from an upper surface of the semiconductor oxide to a lower surface of the semiconductor oxide. The grain boundary is offset from the first region of the insulative material by a first intervening portion of the semiconductor oxide, and is offset from the second region of the insulative material by a second intervening portion of the semiconductor oxide. The semiconductor oxide, the first and second regions of the insulative material, and the first and second regions of the gate material together form a transistor. The transistor is configured such that electric fields along the first and second regions of the gate material induce carrier flow within the semiconductor oxide, with the carrier flow being along a first direction corresponding to the vertical direction of the semiconductor oxide. The carrier flow within the semiconductor oxide is within the first and second intervening regions and substantially parallel to the grain boundary.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a gate material;
an insulative material adjacent to the gate material; and
a semiconductor oxide adjacent to the insulative material;
the semiconductor oxide having a channel region proximate the gate material and spaced from the gate material by at least the insulative material; wherein a carrier flow is induced along a first direction in response to an electric field along the gate material; the semiconductor oxide being polycrystalline; individual grains of the polycrystalline semiconductor oxide being peripherally bounded by grain boundaries; at least one of the grain boundaries having a portion which extends along a second direction, with the second direction crossing the first direction of the carrier flow.

2. The integrated assembly of claim 1 wherein the individual grains are cubic crystallinity dominated.

3. The integrated assembly of claim 1 wherein the semiconductor oxide is predominately of cubic crystallinity.

4. The integrated assembly of claim 1 wherein the gate material, insulative material and semiconductor oxide are supported by a semiconductor base having a horizontally-extending upper surface, and wherein the carrier flow extends substantially parallel relative to the horizontally-extending upper surface.

5. The integrated assembly of claim 1 wherein the gate material, insulative material and semiconductor oxide are supported by a semiconductor base having a horizontally-extending upper surface, and wherein the carrier flow extends substantially orthogonally relative to the horizontally-extending upper surface.

6. The integrated assembly of claim 1 wherein the semiconductor oxide includes one or more of indium, zinc, tin and gallium.

7. The integrated assembly of claim 1 wherein the semiconductor oxide includes indium, zinc and gallium.

8. The integrated assembly of claim 7 wherein the indium, zinc and gallium are each present in the semiconductor oxide to a metal atomic percent, and wherein:
the metal atomic percent of the indium is within a range of from about 14 to about 24;
the metal atomic percent of the gallium is within a range of from about 37 to about 47; and
the metal atomic percent of the zinc is within a range of from about 35 to about 45.

9. The integrated assembly of claim 7 wherein the indium, zinc and gallium are each present in the semiconductor oxide to a metal atomic percent, and wherein:
the metal atomic percent of the indium is within a range of from about 16 to about 22;
the metal atomic percent of the gallium is within a range of from about 39 to about 45; and
the metal atomic percent of the zinc is within a range of from about 37 to about 43.

10. The integrated assembly of claim 7 wherein the indium, zinc and gallium are each present in the semiconductor oxide to a metal atomic percent, and wherein:
the metal atomic percent of the indium is about 19;
the metal atomic percent of the gallium is about 42; and
the metal atomic percent of the zinc is about 40.

11. The integrated assembly of claim 1 wherein the insulative material is a high-k material.

12. The integrated assembly of claim 1 wherein the insulative material is a metal oxide.

13. The integrated assembly of claim 1 wherein the insulative material comprises one or more of aluminum oxide, hafnium oxide, zirconium oxide and titanium oxide.

14. An integrated assembly, comprising:
a gate material;
an insulative material adjacent to the gate material; and
a semiconductor oxide adjacent to the insulative material;
the semiconductor oxide having a channel region proximate the gate material and spaced from the gate material by at least the insulative material; wherein a carrier flow is induced along a first direction in response to an electric field along the gate material; the semiconductor oxide having at least one grain boundary which extends along the first direction and which is offset from the insulative material by an intervening portion of the semiconductor oxide; the carrier flow being within the intervening region and substantially parallel to said at least one grain boundary.

15. The integrated assembly of claim 14 wherein individual grains of the semiconductor oxide are cubic crystallinity dominated.

16. The integrated assembly of claim 14 wherein the semiconductor oxide is predominately of cubic crystallinity.

17. The integrated assembly of claim 14 wherein the gate material, insulative material and semiconductor oxide are supported by a semiconductor base having a horizontally-extending upper surface, and wherein the carrier flow extends substantially parallel relative to the horizontally-extending upper surface.

18. The integrated assembly of claim 14 wherein the gate material, insulative material and semiconductor oxide are supported by a semiconductor base having a horizontally-extending upper surface, and wherein the carrier flow extends substantially orthogonally relative to the horizontally-extending upper surface.

19. The integrated assembly of claim 14 wherein the semiconductor oxide includes one or more of indium, zinc, tin and gallium.

20. The integrated assembly of claim 14 wherein the semiconductor oxide includes indium, zinc and gallium.

21. The integrated assembly of claim 20 wherein the indium, zinc and gallium are each present in the semiconductor oxide to a metal atomic percent, and wherein:
the metal atomic percent of the indium is within a range of from about 16 to about 26;
the metal atomic percent of the gallium is within a range of from about 45 to about 55; and
the metal atomic percent of the zinc is within a range of from about 24 to about 34.

22. The integrated assembly of claim 20 wherein the indium, zinc and gallium are each present in the semiconductor oxide to a metal atomic percent, and wherein:
the metal atomic percent of the indium is within a range of from about 18 to about 24;
the metal atomic percent of the gallium is within a range of from about 47 to about 53; and
the metal atomic percent of the zinc is within a range of from about 26 to about 32.

23. The integrated assembly of claim 20 wherein the indium, zinc and gallium are each present in the semiconductor oxide to a metal atomic percent, and wherein:
the metal atomic percent of the indium is about 21;
the metal atomic percent of the gallium is about 50; and
the metal atomic percent of the zinc is about 29.

24. An integrated assembly, comprising:
a semiconductor oxide extending along a vertical direction between a first conductive contact and a second conductive contact; the semiconductor oxide having first and second opposing sidewall surfaces along a cross-section;
a first region of an insulative material adjacent to the first sidewall surface, and a second region of the insulative material adjacent to the second sidewall surface;
a first region of a gate material adjacent to the first region of the insulative material and spaced from the first sidewall surface by at least the first region of the insulative material, and a second region of the gate material along the second region of the insulative material and spaced from the second sidewall surface by at least the second region of the insulative material; and
wherein carrier flow within the semiconductor oxide is induced in response to electric fields along the first and second regions of the gate material, with the carrier flow being along a first direction corresponding to the vertical direction of the semiconductor oxide; wherein the semiconductor oxide is polycrystalline; wherein individual grains of the polycrystalline semiconductor oxide are peripherally bounded by grain boundaries; and wherein at least one of the grain boundaries has a portion which extends along a second direction, with the second direction crossing the first direction of the carrier flow.

25. The integrated assembly of claim 24 wherein the individual grains are cubic crystallinity dominated.

26. The integrated assembly of claim 24 wherein the semiconductor oxide is predominately of cubic crystallinity.

27. The integrated assembly of claim 24 wherein the semiconductor oxide includes indium, zinc and gallium.

28. The integrated assembly of claim 27 wherein the indium, zinc and gallium are each present in the semiconductor oxide to a metal atomic percent, and wherein:
the metal atomic percent of the indium is within a range of from about 16 to about 22;
the metal atomic percent of the gallium is within a range of from about 39 to about 45; and
the metal atomic percent of the zinc is within a range of from about 37 to about 43.

29. The integrated assembly of claim 27 wherein the indium, zinc and gallium are each present in the semiconductor oxide to a metal atomic percent, and wherein:
the metal atomic percent of the indium is about 19;
the metal atomic percent of the gallium is about 42; and
the metal atomic percent of the zinc is about 40.

30. The integrated assembly of claim 24 comprising a digit line coupled with one of the first and second conductive contacts, and comprising a charge-storage device coupled with the other of the first and second conductive contacts.

31. The integrated assembly of claim 30 wherein:
the semiconductor oxide, the first and second regions of the insulative material; and the first and second regions of the gate material together form an access device;
the access device and the charge-storage device together form a memory device; and
said memory device is one of many substantially identical memory devices within a memory array.

32. An integrated assembly, comprising:
a semiconductor oxide extending along a vertical direction between a first conductive contact and a second conductive contact; the semiconductor oxide having first and second opposing sidewall surfaces along a cross-section;
a first region of an insulative material adjacent to the first sidewall surface, and a second region of the insulative material adjacent to the second sidewall surface;
a first region of a gate material adjacent to the first region of the insulative material and spaced from the first sidewall surface by at least the first region of the insulative material, and a second region of the gate material adjacent to the second region of the insulative material and spaced from the second sidewall surface by at least the second region of the insulative material;
a grain boundary within the semiconductor oxide and extending along the vertical direction; the grain boundary traversing an entire length of the semiconductor oxide from the first contact to the second contact; the grain boundary being offset from the first region of the insulative material by a first intervening portion of the semiconductor oxide, and being offset from the second region of the insulative material by a second intervening portion of the semiconductor oxide; and wherein carrier flow within the semiconductor oxide is induced in response to electric fields along the first and second regions of the gate material, with the carrier flow being along the vertical direction of the semiconductor oxide; and wherein the carrier flow within the semiconductor oxide is within the intervening regions and substantially parallel to the grain boundary.

33. The integrated assembly of claim 32 wherein individual grains of the semiconductor oxide are cubic crystallinity dominated.

34. The integrated assembly of claim 32 wherein the semiconductor oxide is predominately of cubic crystallinity.

35. The integrated assembly of claim 32 comprising a digit line coupled with one of the first and second conductive contacts, and comprising a charge-storage device coupled with the other of the first and second conductive contacts.

36. The integrated assembly of claim 35 wherein:
the semiconductor oxide, the first and second regions of the insulative material; and the first and second regions of the gate material together form an access device;
the access device and the charge-storage device together form a memory device; and
said memory device is one of many substantially identical memory devices within a memory array.

37. The integrated assembly of claim 32 wherein the semiconductor oxide includes indium, zinc and gallium.

38. The integrated assembly of claim 37 wherein the indium, zinc and gallium are each present in the semiconductor oxide to a metal atomic percent, and wherein:
the metal atomic percent of the indium is within a range of from about 18 to about 24;
the metal atomic percent of the gallium is within a range of from about 47 to about 53; and
the metal atomic percent of the zinc is within a range of from about 26 to about 32.

39. The integrated assembly of claim 37 wherein the indium, zinc and gallium are each present in the semiconductor oxide to a metal atomic percent, and wherein:
the metal atomic percent of the indium is about 21;
the metal atomic percent of the gallium is about 50; and
the metal atomic percent of the zinc is about 29.

40. A method of forming an integrated assembly, comprising:
depositing semiconductor oxide over a conductive material; the semiconductor oxide comprising indium, gallium and zinc; the depositing being physical vapor depositing and being conducted within a chamber utilizing an ambient within the chamber having a temperature within a range of from about 20° C. to about 500° C., and a pressure within a range of from about 1 mTorr to about 9 mTorr; the deposited semiconductor oxide being polycrystalline;
patterning the deposited semiconductor oxide into a vertically-extending structure; the vertically-extending structure having first and second opposing sidewall surfaces along a cross-section;
forming insulative material along the first and second opposing sidewall surfaces; a first region of the insulative material being along the first sidewall surface, and a second region of the insulative material being along the second sidewall surface;
forming gate material along the insulative material; a first region of the gate material being along the first region of the insulative material, and a second region of the gate material being along the second region of the insulative material; and wherein the semiconductor oxide, the first and second regions of the insulative material, and the first and second regions of the gate material together form a transistor; wherein the transistor is configured such that electric fields along the first and second regions of the gate material induce carrier flow within the semiconductor oxide, with the carrier flow being along a first direction corresponding to the vertical direction of the semiconductor oxide; wherein individual grains of the polycrystalline semiconductor oxide are peripherally bounded by grain boundaries; and wherein at least one of the grain boundaries has a portion which extends along a second direction, with the second direction crossing the first direction of the carrier flow.

41. The method of claim 40 wherein the semiconductor oxide is deposited directly onto the conductive material.

42. The method of claim 41 wherein the conductive material comprises one or both of ruthenium and tungsten.

43. The method of claim 40 wherein the indium, zinc and gallium are each present in the semiconductor oxide to a metal atomic percent, and wherein:
the metal atomic percent of the indium is within a range of from about 14 to about 24;
the metal atomic percent of the gallium is within a range of from about 37 to about 47; and
the metal atomic percent of the zinc is within a range of from about 35 to about 45.

44. The method of claim 40 wherein the indium, zinc and gallium are each present in the semiconductor oxide to a metal atomic percent, and wherein:
the metal atomic percent of the indium is within a range of from about 16 to about 22;
the metal atomic percent of the gallium is within a range of from about 39 to about 45; and
the metal atomic percent of the zinc is within a range of from about 37 to about 43.

45. The method of claim 40 wherein the indium, zinc and gallium are each present in the semiconductor oxide to a metal atomic percent, and wherein:
the metal atomic percent of the indium is about 19;
the metal atomic percent of the gallium is about 42; and
the metal atomic percent of the zinc is about 40.

46. A method of forming an integrated assembly, comprising:
depositing semiconductor oxide over a supporting material; the semiconductor oxide comprising indium, gallium and zinc;
patterning the deposited semiconductor oxide into a vertically-extending structure; the vertically-extending structure having first and second opposing sidewall surfaces along a cross-section;
forming insulative material along the first and second opposing sidewall surfaces; a first region of the insulative material being along the first sidewall surface, and a second region of the insulative material being along the second sidewall surface;
forming gate material along the insulative material; a first region of the gate material being along the first region of the insulative material, and a second region of the gate material being along the second region of the insulative material;
after forming the insulative material, annealing the semiconductor oxide under conditions which maintain a temperature of the semiconductor oxide within a range of from about 400° C. to about 600° C. for a duration of from at least about 30 minutes to less than or equal to about 1 day;

after said annealing, a grain boundary being within the semiconductor oxide extending along the vertical direction; the grain boundary traversing an entire length of the semiconductor oxide from an upper surface of the semiconductor oxide to a lower surface of the semiconductor oxide; the grain boundary being offset from the first region of the insulative material by a first intervening portion of the semiconductor oxide, and being offset from the second region of the insulative material by a second intervening portion of the semiconductor oxide; and wherein the semiconductor oxide, the first and second regions of the insulative material, and the first and second regions of the gate material together form a transistor; wherein the transistor is configured such that electric fields along the first and second regions of the gate material induce carrier flow within the semiconductor oxide, with the carrier flow being along a first direction corresponding to the vertical direction of the semiconductor oxide; the carrier flow within the semiconductor oxide being within the first and second intervening regions and substantially parallel to the grain boundary.

47. The method of claim 46 wherein the depositing comprises one or more of physical vapor deposition, chemical vapor deposition and atomic layer deposition.

48. The method of claim 46 wherein the annealing is conducted within a chamber after the gate material is formed, and while a top portion of semiconductor oxide is exposed to an ambient inside the chamber.

49. The method of claim 48 wherein the said ambient consists of gases inert relative to reaction with the exposed top portion of the semiconductor oxide.

50. The method of claim 48 wherein the said ambient comprises a reductant.

51. The method of claim 48 wherein the said ambient comprises an oxidant.

52. The method of claim 46 wherein the indium, zinc and gallium are each present in the semiconductor oxide to a metal atomic percent, and wherein:
the metal atomic percent of the indium is within a range of from about 16 to about 26;
the metal atomic percent of the gallium is within a range of from about 45 to about 55; and
the metal atomic percent of the zinc is within a range of from about 24 to about 34.

53. The method of claim 46 wherein the indium, zinc and gallium are each present in the semiconductor oxide to a metal atomic percent, and wherein:
the metal atomic percent of the indium is within a range of from about 18 to about 24;
the metal atomic percent of the gallium is within a range of from about 47 to about 53; and
the metal atomic percent of the zinc is within a range of from about 26 to about 32.

54. The method of claim 46 wherein the indium, zinc and gallium are each present in the semiconductor oxide to a metal atomic percent, and wherein:
the metal atomic percent of the indium is about 21;
the metal atomic percent of the gallium is about 50; and
the metal atomic percent of the zinc is about 29.

* * * * *